United States Patent
Roh et al.

(10) Patent No.: US 9,841,604 B2
(45) Date of Patent: Dec. 12, 2017

(54) COLOR SEPARATION DEVICE AND IMAGE SENSOR INCLUDING THE COLOR SEPARATION DEVICE

(71) Applicant: Samsung Electronics Co., Ltd., Suwon-si, Gyeonggi-do (KR)

(72) Inventors: Sookyoung Roh, Suwon-si (KR); Sunghyun Nam, Yongin-si (KR); Changgyun Shin, Anyang-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 297 days.

(21) Appl. No.: 14/678,462

(22) Filed: Apr. 3, 2015

(65) Prior Publication Data

US 2015/0286060 A1    Oct. 8, 2015

(30) Foreign Application Priority Data

Apr. 7, 2014  (KR) .......................... 10-2014-0041494

(51) Int. Cl.
*H01J 5/16*   (2006.01)
*G02B 27/10*  (2006.01)
(Continued)

(52) U.S. Cl.
CPC ....... *G02B 27/1013* (2013.01); *G02B 3/0006* (2013.01); *G02B 5/201* (2013.01);
(Continued)

(58) Field of Classification Search
CPC .. G02B 27/1013; G02B 27/12; G02B 27/123; G02B 27/126
See application file for complete search history.

(56) References Cited

U.S. PATENT DOCUMENTS 5,002,364 A * 3/1991 Steenblik ................. G02B 5/04
                                                      348/E13.033
6,104,446 A   8/2000 Blankenbecler et al.
(Continued)

FOREIGN PATENT DOCUMENTS

EP    2006121131   10/2007
KR    19990077317  10/1999
(Continued)

*Primary Examiner* — Thanh Luu
(74) *Attorney, Agent, or Firm* — Harness, Dickey & Pierce, P.L.C.

(57) ABSTRACT

A color separation device changes a light path according to the wavelengths of incident light and an image sensor has improved light utilization efficiency by using the color separation device. The color separation device may include a first element having a first refractive index that varies according to wavelengths of light along a first refractive index distribution curve, and a second element having a second refractive index that varies according to wavelengths of light along a second refractive index distribution curve, the second refractive index distribution curve being different from the first refractive index distribution curve. The color separation device may be manufactured by simply joining two elements, namely, the first and second elements, together and thus may be more easily manufactured and perform more effective color separation.

6 Claims, 13 Drawing Sheets

(51) Int. Cl.
  *G02B 27/12* (2006.01)
  *G02B 3/00* (2006.01)
  *G02B 5/20* (2006.01)
  *H01L 27/146* (2006.01)

(52) U.S. Cl.
  CPC ........ *G02B 27/12* (2013.01); *H01L 27/14621* (2013.01); *H01L 27/14627* (2013.01); *G02B 27/102* (2013.01)

(56) References Cited

U.S. PATENT DOCUMENTS

| | | | |
|---|---|---|---|
| 7,176,446 B1* | 2/2007 | Wiedemann | G01J 3/02 250/208.1 |
| 7,714,368 B2 | 5/2010 | Yang et al. | |
| 2002/0005471 A1* | 1/2002 | Suzuki | H01L 27/14625 250/208.1 |
| 2003/0184854 A1* | 10/2003 | Kamimura | G02B 21/00 359/368 |
| 2007/0298533 A1* | 12/2007 | Yang | G02B 5/1871 438/57 |
| 2010/0051785 A1* | 3/2010 | Dai | H01L 27/1464 250/208.1 |
| 2011/0061689 A1 | 3/2011 | Mitchell et al. | |
| 2013/0041221 A1* | 2/2013 | McDowall | A61B 1/00096 600/111 |

FOREIGN PATENT DOCUMENTS

| | | |
|---|---|---|
| KR | 20030056096 | 7/2003 |
| KR | 20040059969 | 7/2004 |
| KR | 20110023107 | 3/2011 |

\* cited by examiner

COLOR SEPARATION DEVICE AND IMAGE SENSOR INCLUDING THE COLOR SEPARATION DEVICE

RELATED APPLICATIONS

This application claims the benefit of Korean Patent Application No. 10-2014-0041494, filed on Apr. 7, 2014, in the Korean Intellectual Property Office, the disclosure of which is incorporated herein in its entirety by reference.

BACKGROUND

1. Field

The present disclosure relates to color separation devices and image sensors including the color separation devices, such as a color separation device which changes a light path according to the wavelengths of incident light, and an image sensor having improved light utilization efficiency by using the color separation device.

2. Description of the Related Art

Color display devices or color image sensors generally display images of various colors or detect colors of incident light by using color filters. In a current color display device or a color image sensor, an RGB color filter mechanism is most popularly employed, in which, for example, green filters are arranged at two of four pixels and a blue filter and a red filter are respectively arranged at the other two pixels. Furthermore, other than the RGB color filter mechanism, a CYGM color filter mechanism may also be employed, in which cyan, yellow, green, and magenta color filters (complementary colors) are respectively arranged at four pixels.

However, a general absorptive color filter absorbs lights of colors other than a color corresponding to the color filter, and thus light utilization efficiency may deteriorate. For example, in the case of using RGB color filters, only one-third of incident light is transmitted and two-thirds of the incident light is absorbed, and thus light utilization efficiency is only about 33%. Therefore, in a color display apparatus or a color image sensor, most light loss occurs in color filters.

Recently, to improve light utilization efficiency of a color display apparatus or a color image sensor, there have been attempts to use a color separation device instead of color filters. A color separation device may separate colors of incident light by using a diffraction characteristic or a refraction characteristic that differs based on wavelengths, and colors separated by the color separation device may be transmitted to pixels corresponding to the colors, respectively. However, a color separation device is still unable to provide images that are as clear as images provided by using color filters.

SUMMARY

Provided are color separation devices that change a light path according to wavelengths of incident light.

Provided are image sensors having improved light utilization efficiency by using the color separation devices.

Additional aspects will be set forth in part in the description which follows and, in part, will be apparent from the description, or may be learned by practice of the presented example embodiments.

According to an embodiment, a color separation device includes a first element having a first refractive index that varies according to wavelengths of light along a first refractive index distribution curve, a second element having a second refractive index that varies according to wavelengths of light along a second refractive index distribution curve, the second refractive index distribution curve being different from the first refractive index distribution curve and a junction surface between the first and second elements formed by joining the first and second elements together.

The first refractive index distribution curve and the second refractive index distribution curve may intersect at at least one point.

For example, the first refractive index of the first element may be greater than the second refractive index of the second element in a first wavelength region, the first refractive index of the first element may be equal to the second refractive index of the second element in a second wavelength region, and the first refractive index of the first element may be less than the second refractive index of the second element in a third wavelength region.

For example, the first wavelength region may be a blue region, the second wavelength region may be a green region, and the third wavelength region may be a red region.

For example, the first and second elements may include at least one of silicon nitride (SiN), titanium oxide ($TiO_2$) and zinc oxide ($ZnO_2$).

The color separation device may include a light incidence surface on which light is incident and a light exit surface through which light beams of separated colors exit, the junction surface may be between the light incidence surface and the light exit surface and may be at an angle with respect to the light incidence surface and the light exit surface.

The color separation device may further include a condensing lens opposite to the light incidence surface to concentrate light on the junction surface.

The color may include a light incidence surface on which light is incident and a light exit surface through which light beams of separated colors exit, the junction surface may be between the light incidence surface and the light exit surface and may be perpendicular to the light incidence surface and the light exit surface.

According to an embodiment, an image sensor includes a pixel array comprising a plurality of pixels configured to sense light beams of different wavelengths, respectively, and a color separation device array including a plurality of color separation devices, each color separation device facing at least two of the plurality of pixels included in the pixel array. Each of the color separation devices includes a first element having a first refractive index that varies according to wavelengths of light along a first refractive index distribution curve, a second element having a second refractive index that varies according to wavelengths of light along a second refractive index distribution curve, the second refractive index distribution curve being different from the first refractive index distribution curve, and a junction surface between the first and second elements formed by joining the first and second elements together.

Each of the color separation devices may be configured such that the first refractive index distribution curve and the second refractive index distribution curve intersect at at least one point, and a pixel that receives light of a wavelength corresponding to an intersection point of the first refractive index distribution curve and the second refractive index distribution curve, from among the plurality of pixels included in the pixel array, faces a center of each of the color separation devices.

The pixel array may include a first pixel configured to sense light of a first wavelength, a second pixel configured to sense light of a second wavelength, and a third pixel configured to sense light of a third wavelength. The first through third pixels may be sequentially arranged adjacent to each other and repeatedly, and each of the color separation devices faces a first pixel, a second pixel, and a third pixel that are adjacently arranged.

Each of the color separation devices may further include a condensing lens opposite to a light incidence surface of each of the color separation devices over the first through third pixels to concentrate light on the junction surface.

The pixel array may include a first pixel configured to sense light of a first wavelength, a second pixel configured to sense light of a second wavelength, and a third pixel configured to sense light of a third wavelength, and the first and third pixels may alternately and repeatedly arranged with the second pixel between the first pixel and third pixels.

The color separation device array may include a plurality of first color separation devices and a plurality of second color separation devices that are alternately repeated, and left and right sides of each of the first color separation devices and each of the second color separation devices may be opposites.

A first edge of each of the first color separation devices may face a center of the first pixel, a second edge of the each first color separation device may face a center of the third pixel, a first edge of each of the second color separation devices may face the center of the third pixel, a second edge of each of the second color separation devices may face the center of the first pixel, and a center of each of the first and second color separation devices may face the second pixel.

Each of the color separation devices may further include a condensing lens opposite to a light incidence surface of each of the color separation devices over the center of the first pixel through to the center of the third pixel to concentrate light on the junction surface.

The pixel array may include a plurality of first pixels configured to sense light of a first wavelength, a plurality of second pixels configured to sense light of a second wavelength, and a plurality of third pixels configured to sense light of a third wavelength. The pixel array includes a first pixel row including the plurality of the second pixels are arranged and a second pixel row including the plurality of the first pixels and the plurality of third pixels alternating. Each of the color separation devices faces one of the first pixels and one of the third pixels arranged adjacent to each other in the second pixel row.

Each of the color separation devices may further include a condensing lens opposite to a light incidence surface of each of the color separation devices to face one of the first pixels and one of the third pixels arranged adjacent to each other in the second pixel row to concentrate light on the junction surface.

Each of the plurality of pixels may include a light sensing layer configured to convert the intensity of incident light to an electrical signal and a transparent spacer layer on the light sensing layer. Each of the color separation devices may be on the transparent spacer layer.

Each of the plurality of pixels may further include a microlens between the light sensing layer and the transparent spacer layer.

Each of the plurality of pixels may further include a color filter layer configured to transmit only light of a specific wavelength region and block light of other wavelength regions.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
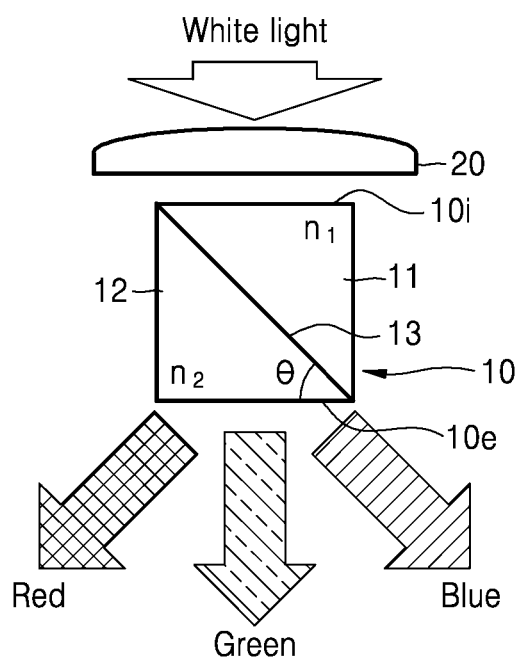
FIG. 1 is a schematic cross-sectional view of a color separation device according to an example embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. Expressions such as "at least one of," when preceding a list of elements, modify the entire list of elements and do not modify the individual elements of the list.

A color separation device and an image sensor including the color separation device will now be described in detail with reference to the accompanying drawings, in which exemplary embodiments are shown. Like reference numerals in the drawings denote like elements, and, in the drawings, the sizes of elements may be exaggerated for clarity and for convenience of explanation. In this regard, the present embodiments may have different forms and should not be construed as being limited to the descriptions set forth herein. It will be understood that when a layer is referred to as being "on" another layer or substrate, it can be directly on the other layer or substrate, or intervening layers may also be present.

FIG. 1 is a schematic cross-sectional view of a color separation device 10 according to an example embodiment. Referring to FIG. 1, the color separation device 10 according to the present embodiment may include a first element 11 and a second element 12 which are transparent and are joined to each other. The color separation device 10 may further include a light incidence surface 10$i$ on which light is incident, a junction surface 13 between the first element 11 and the second element 12, a light exit surface 10$e$ through which light beams having colors separated by the junction surface 13 exit, and a condensing lens 20 arranged opposite to the light incidence surface 10$i$ to concentrate light on the junction surface 13.

Figure 2:
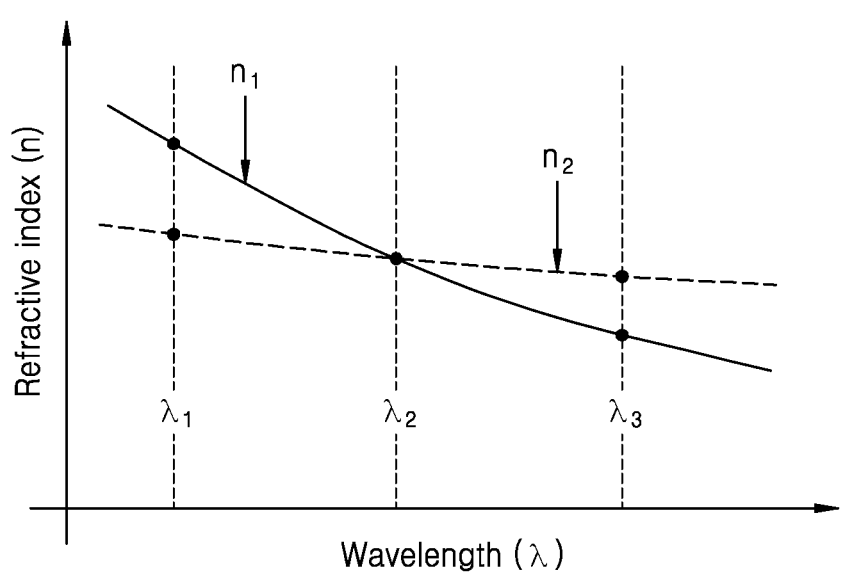
FIG. 2 is a graph showing refractive index distribution curves of a first element and a second element of the color separation device of FIG. 1 versus wavelengths.

The first element 11 and the second element 12 may be formed of materials of which refractive indices vary differently according to wavelengths. Examples of the materials used to form the first element 11 and the second element 12 include SiN, $TiO_2$, and $ZnO_2$. For example, FIG. 2 is a graph illustrating first and second refractive index distribution curves $n_1$ and $n_2$ of the first and second elements 11 and 12 of the color separation device 10 versus wavelengths, when the first element 11 is formed of $TiO_2$ and the second element 12 is formed of SiN, respectively. Referring to FIG. 2, the first element 11 may have the first refractive index distribution curve $n_1$ in which a refractive index thereof varies according to wavelengths, and the second element 12 may have the second refractive index distribution curve $n_2$ in which a refractive index thereof varies according to wavelengths differently from the first refractive index distribution curve $n_1$.

As shown in FIG. 2, the first refractive index distribution curve $n_1$ and the second refractive index distribution curve $n_2$ may intersect at at least one point. For example, the first refractive index distribution curve $n_1$ and the second refractive index distribution curve $n_2$ may intersect each other at a second wavelength region $\lambda_2$ which is a green wavelength region. In other words, the respective refractive indices of the first element 11 and the second element 12 may be equal to each other at the second wavelength $\lambda_2$. The refractive index of the first element 11 may be greater than that of the second element 12 at a first wavelength region $\lambda_1$ which is a blue wavelength region, and the refractive index of the first element 11 may be less than that of the second element 12 at a third wavelength region $\lambda_3$ which is a red wavelength region. However, this is only an example. Depending on the materials selected to form the first and second elements 11 and 12, the refractive index of the first element 11 may be less than that of the second element 12 at the first wavelength region $\lambda_1$, which is a blue wavelength region, and the refractive index of the first element 11 may be greater than that of the second element 12 at the third wavelength region $\lambda_3$, which is a red wavelength region.

Referring back to FIG. 1, the color separation device 10 may have a rectangular shape formed by joining together the first element 11 and the second element 12 each having a right-angled prism. In this case, respective inclined surfaces of the first element 11 and the second element 12 are joined to each other to form the junction surface 13 that is tilt in a diagonal direction. After light concentrated by the condensing lens 20 reaches the junction surface 13 via the light incidence surface 10$i$ formed on the first element 11, light may be refracted at different angles according to wavelengths and may exit to the outside via the light exit surface 10$e$ formed on the second element 12.

Although FIG. 1 illustrates the first and second elements 11 and 12 each having a right-angled prism and the color separation device 10 having a rectangular shape, this is only an example, and the shape of the color separation device 10 and the shape of each of the first element 11 and the second element 12 may vary. For example, FIGS. 3A-3F are cross-sectional views illustrating various structures that the color separation device 10 may have.

Figure 3A:
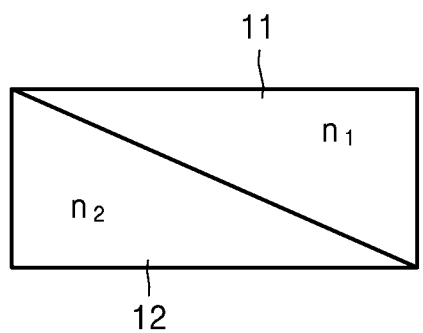
FIGS. 3A-3F are cross-sectional views illustrating various structures that the color separation device of FIG. 1 may have.
Figure 3B:
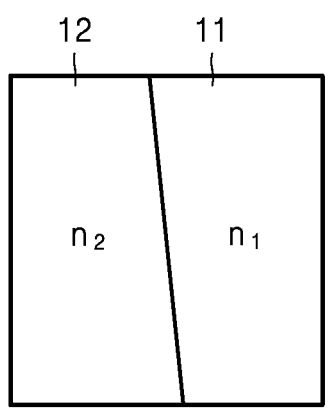
Figure 3C:
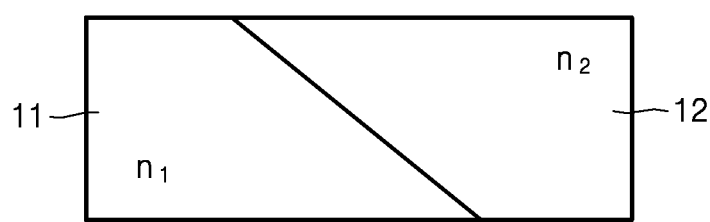

Referring to FIG. 3A, the color separation device 10 may have a shape of a flat rectangle of which a thickness is smaller than its width. As shown in FIG. 3B, the first element 11 and the second element 12 may each have a wedge shape. In this case, the light incidence surface 10$i$ of the color separation device 10 may be formed by respective upper surfaces of the first element 11 and the second element 12, and the light exit surface 10$e$ of the color separation device 10 may be formed by respective lower surfaces of the first element 11 and the second element 12. Inclination angles of the junction surface 13 with respect to the light incidence surface 10$i$ and the light exit surface 10$e$ may be almost 90 degrees. As illustrated in FIG. 3C, a color separation device 10 may be formed by joining a first element 11 and a second element 12 each having a shape obtained by cutting an apex of a right-angled prism.

Figure 3D:
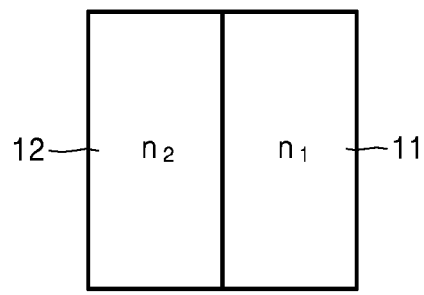
Figure 3E:
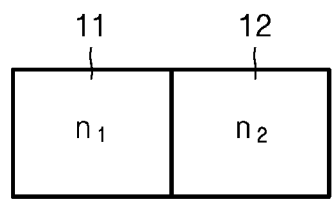
Figure 3F:
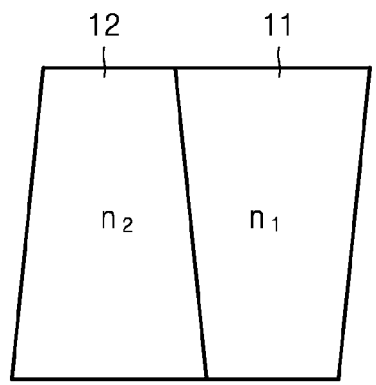

As illustrated in FIGS. 3D and 3E, each color separation device 10 may be formed by joining a first element 11 and a second element 12 each having a rectangular shape. In this case, an inclination angle of the junction surface 13 may be 90 degrees with respect to each of the light incidence surface 10$i$ and the light exit surface 10$e$. As illustrated in FIG. 3D, the color separation device 10 may have a large thickness. Alternatively, as illustrated in FIG. 3E, the color separation device 10 may have a small thickness. In the two cases, the positions of the first element 11 and the second element 12 may be switched. As shown in FIG. 3F, a first element 11 and a second element 12 may have trapezoidal cross-sections and may be joined to each other to form a color separation device 10 having a parallelogram cross-section.

As described above, the color separation device 10 may have any of various shapes. As long as the color separation device 10 is capable of performing color separation by joining the first element 11 having the first refractive index distribution curve $n_1$ in which a refractive index thereof varies according to wavelengths to the second element 12 having the second refractive index distribution curve $n_2$ in which a refractive index thereof varies according to wavelengths differently from the first refractive index distribution curve $n_1$, the color separation device 10 may have any shape. The first element 11 and the second element 12 may directly contact each other, or another material may intervene between the first element 11 and the second element 12. For example, air having a refractive index of 1 may be interposed between the first element 11 and the second element 12 so that light beams that have passed through the color separation device 10 may travel accurately toward pixels of an image sensor according to wavelengths of the light beams. Alternatively, at least one different material other than air may be interposed between the first element 11 and the second element 12.

Figure 4A:
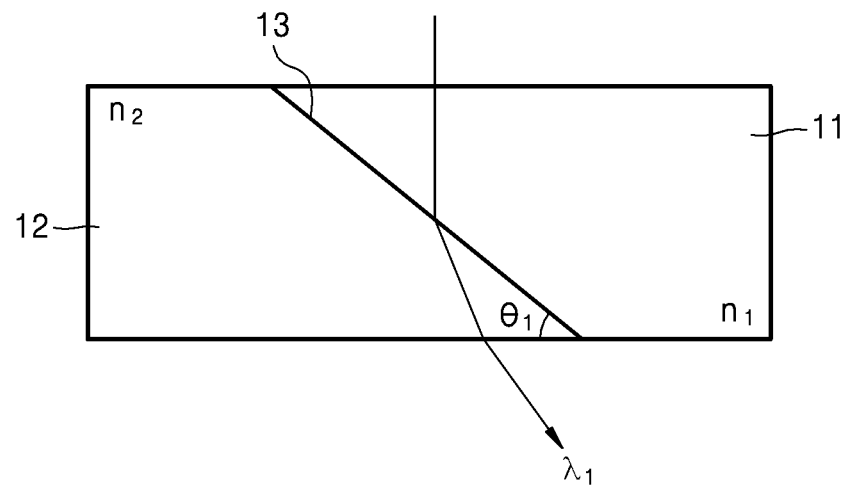
FIGS. 4A-4C are cross-sectional views for explaining an operation of the color separation device of FIG. 3C.
Figure 4B:
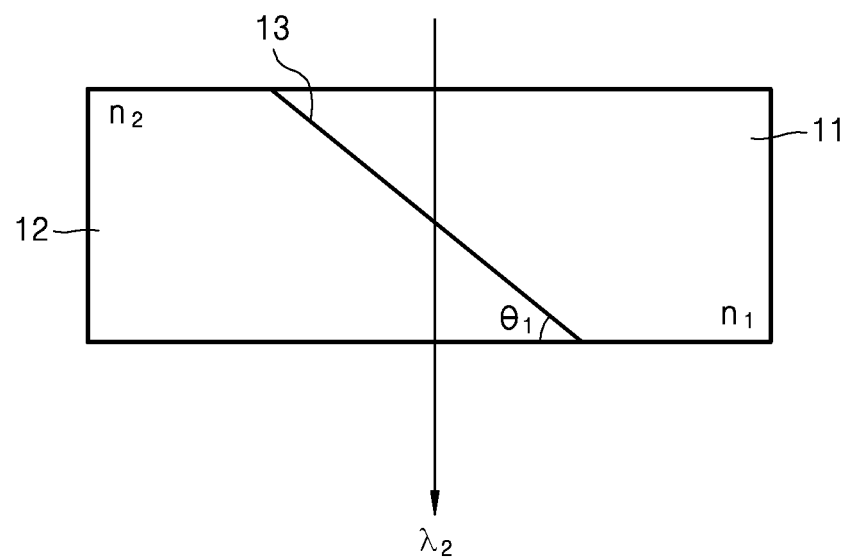
Figure 4C:
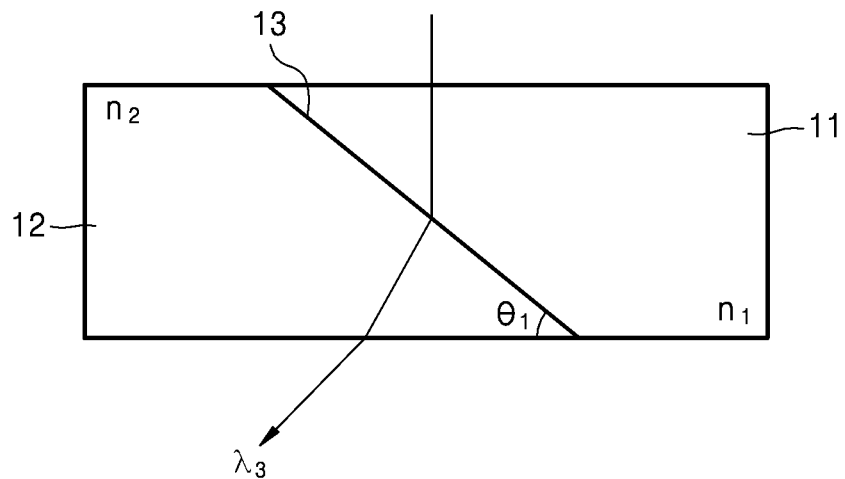

FIGS. 4A-4C are schematic cross-sectional views for explaining an operation of the color separation device 10 of FIG. 3C when the first element 11 and the second element 12 thereof respectively have refractive index distributions illustrated in FIG. 2. In detail, FIG. 4A shows a light travelling path when light of the first wavelength region $\lambda_1$ is incident upon the color separation device 10, FIG. 4B shows a light travelling path when light of the second wavelength region $\lambda_2$ is incident upon the color separation device 10, and FIG. 4C shows a light travelling path when light of the third wavelength region $\lambda_3$ is incident upon the color separation device 10. In the color separation device 10 of FIG. 3C, an inclination angle of the junction surface 13 with respect to the light incidence surface 10$i$ is about 45 degrees.

First, referring to FIG. 4A, for the first wavelength region $\lambda_1$, the refractive index of the first element 11 is greater than that of the second element 12. Accordingly, light of the first wavelength region $\lambda_1$ is refracted rightwards by the inclined junction surface 13 according to Snell's law. Since the respective refractive indices of the first element 11 and the second element 12 are identical with each other for the second wavelength region $\lambda_2$, as shown in FIG. 4B, light of the second wavelength region $\lambda_2$ may not be refracted by the inclined junction surface 13. On the other hand, since the refractive index of the first element 11 is less than that of the second element 12 for the third wavelength region $\lambda_3$, as illustrated in FIG. 4C, light of the second wavelength region $\lambda_3$ may be refracted leftwards by the inclined junction surface 13 according to Snell's law. For example, when the first wavelength region $\lambda_1$ corresponds to blue, the second wavelength region $\lambda_2$ corresponds to green, and the third wavelength region $\lambda_3$ corresponds to red, a red light component in white light incident upon the color separation device 10 may travel toward the left side of the color separation device 10, a green light component therein may travel toward the center of the color separation device 10, and a blue light component therein may travel toward the right side of the color separation device 10.

Figure 5A:
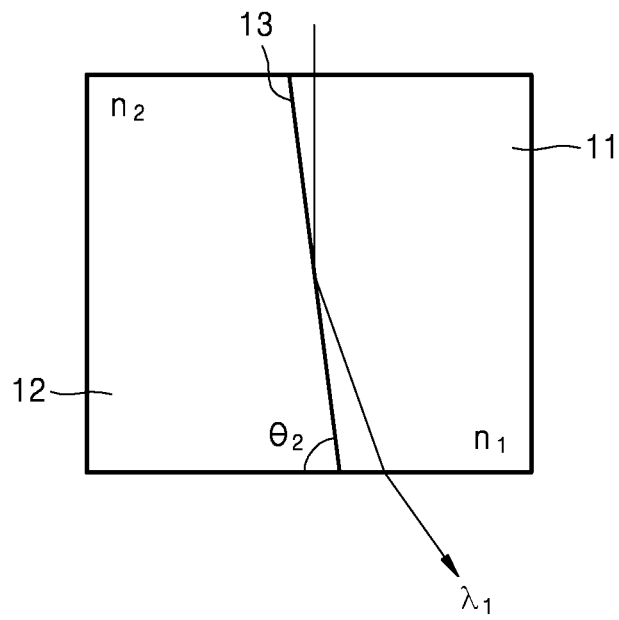
FIGS. 5A-5C are cross-sectional views for explaining an operation of the color separation device of FIG. 3B.
Figure 5B:
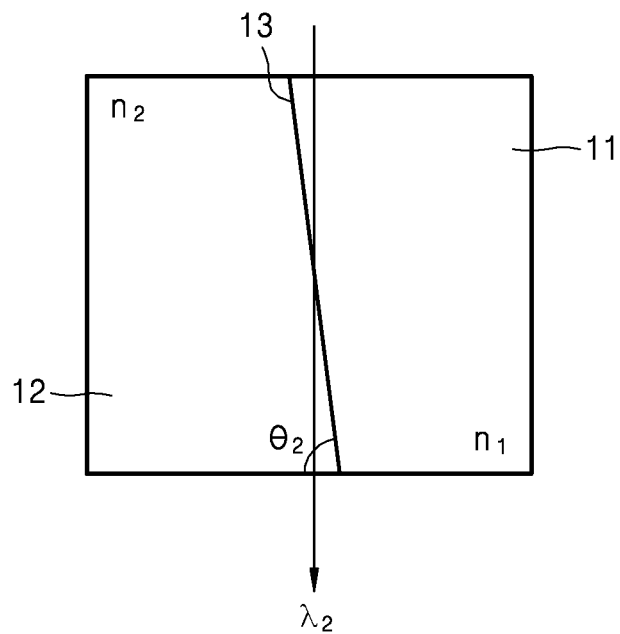
Figure 5C:
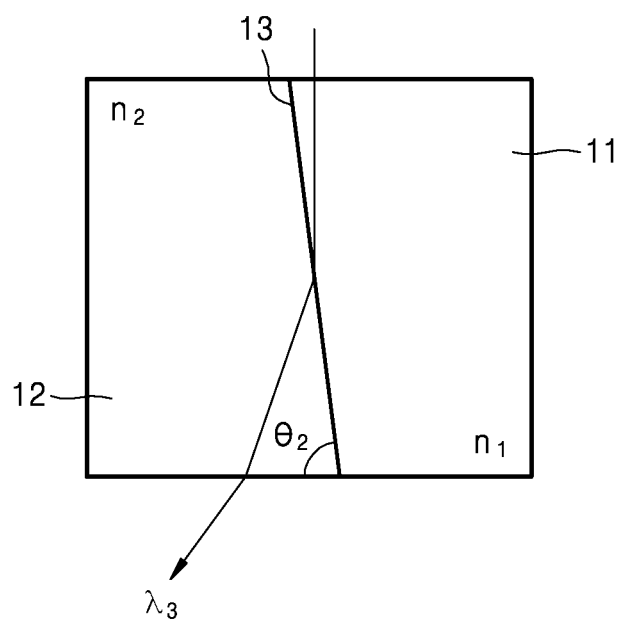

FIGS. 5A-5C are schematic cross-sectional views for explaining an operation of the color separation device 10 of FIG. 3B when the first element 11 and the second element 12 thereof respectively have the refractive index distributions illustrated in FIG. 2. In detail, FIG. 5A shows a light travelling path when light of the first wavelength region $\lambda_1$ is incident upon the color separation device 10, FIG. 5B shows a light travelling path when light of the second wavelength region $\lambda_2$ is incident upon the color separation device 10, and FIG. 5C shows a light travelling path when light of the third wavelength region $\lambda_3$ is incident upon the color separation device 10. In the color separation device 10 of FIG. 3B, an inclination angle of the junction surface 13 with respect to the light incidence surface 10$i$ is about 80 degrees.

First, referring to FIG. 5A, in the first wavelength region $\lambda_1$, the refractive index of the first element 11 is greater than that of the second element 12. Since the inclination angle of the junction surface 13 is high, light of the first wavelength region $\lambda_1$ is slantingly incident upon the junction surface 13 toward the second element 12 having a smaller refractive index than the first element 11. Accordingly, the light of the first wavelength region $\lambda_1$ is totally reflected by the junction surface 13 toward the right side of the color separation device 10. Accordingly, the light of the first wavelength region $\lambda_1$ may be separated from the white light incident upon the color separation device 10, with little light loss. Since the respective refractive indices of the first element 11 and the second element 12 are identical with each other in the second wavelength region $\lambda_2$, as shown in FIG. 5B, the light of the second wavelength region $\lambda_2$ may not be refracted by the junction surface 13. Since the refractive index of the first element 11 is less than that of the second element 12 in the third wavelength region $\lambda_3$, the light of the second wavelength region $\lambda_3$ may be refracted by the junction surface 13 toward the left side of the color separation device 10 according to Snell's law. For example, when the first wavelength region $\lambda_1$ corresponds to a blue, the second wavelength region $\lambda_2$ corresponds to green, and the third wavelength region $\lambda_3$ corresponds to red, a red light component in the white light incident upon the color separation device 10 may travel toward the left side of the color separation device 10, a green light component therein may travel toward the center of the color separation device 10, and a blue light component therein may travel toward the right side of the color separation device 10.

In the cases of FIGS. 3A-5C, light travels from the first element 11 toward the second element 12 via the junction surface 13. However, the positions of the first element 11 and the second element 12 may be switched. In this case, the light of the first wavelength region $\lambda_1$ may travel toward the left side of the color separation device 10 and the light of the third wavelength region $\lambda_3$ may travel toward the right side of the color separation device 10. In other words, the red light component in the white light incident upon the color separation device 10 may travel toward the right side of the color separation device 10 and the blue light component in the white light incident upon the color separation device 10 may travel toward the left side of the color separation device 10.

As described above, the color separation device 10 may perform color separation by using only the principle of refraction or by using both the principles of total reflection and refraction according to the angles of the junction surface 13. The color separation device 10 according to the present embodiment may be manufactured by simply joining two elements, namely, the first and second elements 11 and 12, together and thus may be easily manufactured and also may perform effective color separation. Furthermore, the color separation device 10 according to the present embodiment has a short optical path for color separation and a small size and thus may be applicable to image sensors having small-sized pixels.

Figure 6:
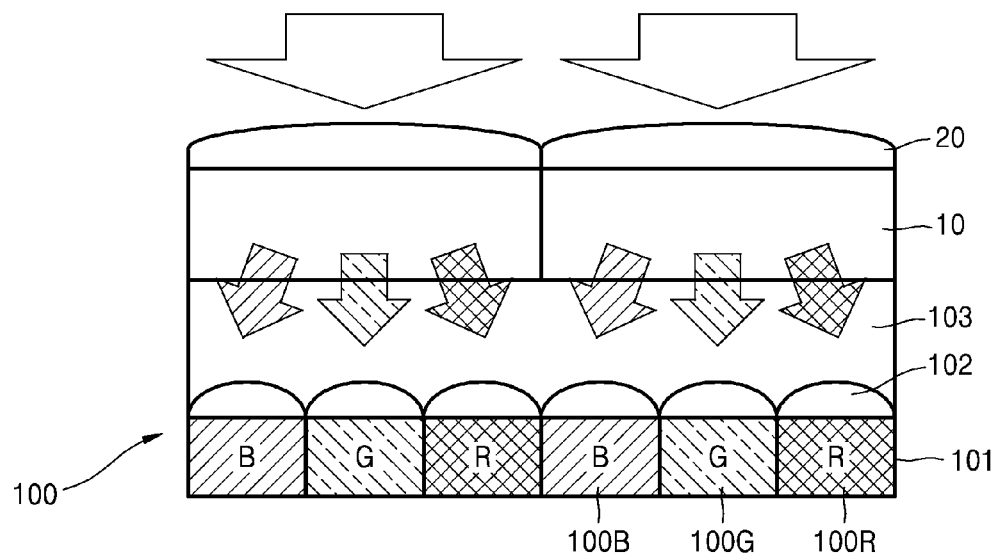
FIG. 6 is a schematic cross-sectional view of an image sensor according to an example embodiment.

FIG. 6 is a schematic sectional view showing a structure of an image sensor 100 that uses the color separation device 10, according to an example embodiment. Referring to FIG. 6, the image sensor 100 may include a pixel array including a plurality of red (R), green (G), and blue (B) pixels 100R, 100G, and 100B sensing light beams of different wavelengths, and a color separation device array that is disposed to face the pixel array and includes a plurality of color separation devices 10. For example, in the embodiment of FIG. 6, the pixel array may include a plurality of R pixels 100R sensing light of a red region, a plurality of G pixels 100G sensing light of a green region, and a plurality of B pixels 100B sensing light of a blue region. An R pixel 100R, a G pixel 100G, and a B pixel 100B may be sequentially arranged adjacent to each other, and this arrangement may be repeated.

Each of the R, G, and B pixels 100R, 100G, and 100B may include a light sensing layer 101 converting the intensity of incident light to an electrical signal, a transparent spacer layer 103 disposed on the light sensing layer 101, and a microlens 102 interposed between the light sensing layer 101 and the transparent spacer layer 103. The transparent spacer layer 103 provides a sufficient distance between the color separation device 10 and the pixel array so that light beams having colors separated by the color separation device 10 may be almost accurately incident upon the R, G, and B pixels 100R, 100G, and 100B, respectively, without cross-talk. The thickness of the transparent spacer layer 103 may be adjusted according to the angles at which light beams of respective color components from the color separation device 10 travel. The transparent spacer layer 103 may be formed of, for example, SiO$_2$. The color separation devices 10 may be arranged on the transparent spacer layer 103.

Figure 7:
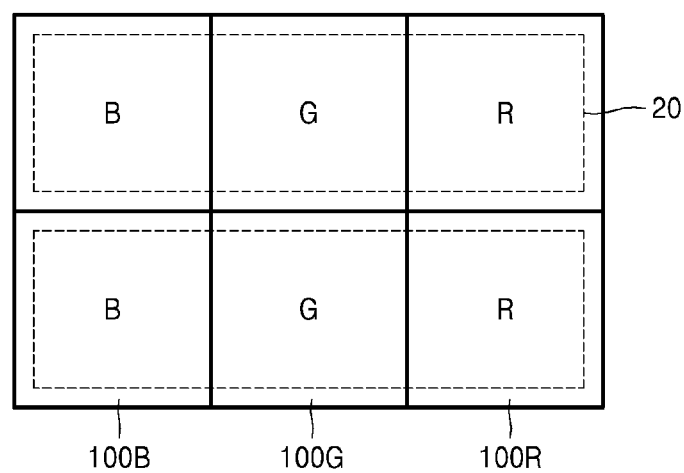
FIG. 7 is a plan view schematically illustrating the pixel configuration of the image sensor of FIG. 6.

As illustrated in FIG. 6, each of the color separation devices 10 may be arranged to face a set of an R pixel 100R, a G pixel 100G, and a B pixel 100B arranged adjacent to each other. A plurality of condensing lenses 20 may be arranged on the color separation devices 10. The condensing lenses 20 may correspond to the color separation devices 10, respectively, to provide incident light to the respective junction surfaces 13 of the color separation devices 10 corresponding to the condensing lenses 20. As illustrated in FIG. 7, each condensing lens 20 may extend over a set of an R pixel 100R, a G pixel 100G, and a B pixel 100B that faces a color separation device 10 corresponding to the condensing lens 20. Accordingly, the width of each of a single color separation device 10 and a single condensing lens 20 may be equal to a total width of three R, G, and B pixels 100R, 100G, and 100B.

In the embodiment of FIG. 6, each color separation device 10 may be configured such that red light travels toward a right region thereof, blue light travels toward a left region thereof, and green light travels toward the center thereof. Then, light beams having color components separated by each color separation device 10 may be accurately incident upon the corresponding R, G, and B pixels 100R, 100G, and 100B. To this end, the G pixel 100G, receiving light of a green wavelength in which a first refractive index distribution curve intersects a second refractive index distribution curve, may be disposed to face the center of the color separation device 10.

Figure 8:
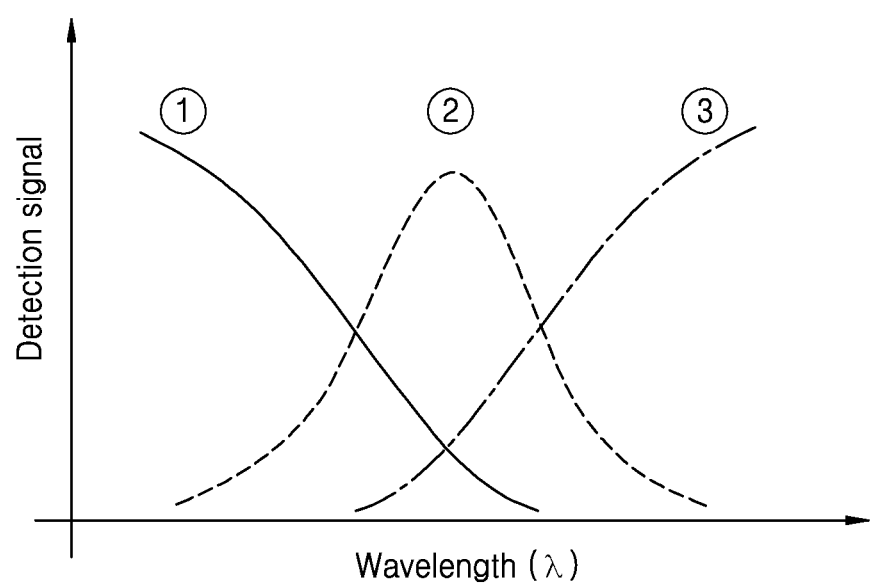
FIG. 8 is a graph illustrating spectrum distributions of light beams respectively incident upon pixels of the image sensor of FIG. 6.

FIG. 8 is a graph illustrating spectrum distributions of light beams respectively incident upon R, G, and B pixels 100R, 100G, and 100B of the image sensor 100. In FIG. 8, curve ① indicates the spectrum distribution of the light beam incident upon the B pixel 100B, curve ② indicates the spectrum distribution of the light beam incident upon the G pixel 100G, and curve ③ indicates the spectrum distribution of light beam incident upon the R pixel 100R. As shown in FIG. 8, light beams of separated color components are almost accurately incident upon R, G, and B pixels 100R, 100G, and 100B corresponding to the light beams. Thus, the image sensor 100 according to the present embodiment may have improved light utilization efficiency because there is no need to use a color filter.

Figure 9:
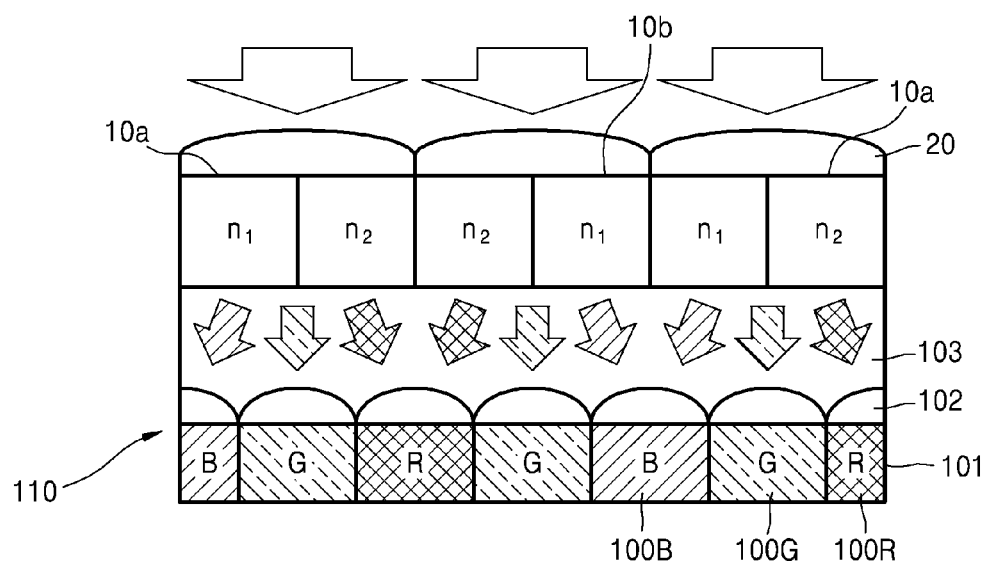
FIG. 9 is a schematic cross-sectional view of an image sensor according to another example embodiment.

FIG. 9 is a schematic cross-sectional view of a structure of an image sensor 110 according to another example embodiment. Referring to FIG. 9, the image sensor 110 may include a pixel array including a plurality of R, G, and B pixels 100R, 100G, and 100B sensing light beams of different wavelengths, and a color separation device array that is disposed to face the pixel array and includes a plurality of first and second color separation devices 10*a* and 10*b*. In the embodiment of FIG. 9, the pixel array may include the R pixels 100R, the G pixels 100G, and the B pixels 100B. The R pixels 100R and the B pixels 100B may be alternately repeated with the G pixel 100G between the R and B pixels 100R and 100G. For example, as shown in FIG. 9, an array of a B pixel 100B, a G pixel 100G, a R pixel 100R, and another G pixel 100G may be repeated.

The color separation device array may include the first color separation devices 10*a* and the second color separation devices 10*b* that are alternately arranged. Left and right sides of each first color separation device 10*a* and those of the second color separation device 10*b* are opposites. For example, each first color separation device 10*a* may be configured such that red light travels toward its right region, blue light travels toward its left region, and green light travels toward its center. On the other hand, each second color separation device 10*b* may be configured such that red light travels toward its left region, blue light travels toward its right region, and green light travels toward its center.

Each of the first and second color separation devices 10*a* and 10*b* may extend between a center of a B pixel 100B and a center of the R pixel 100R adjacent to the B pixel 100B. For example, a left edge of a first color separation device 10*a* may face a center of a B pixel 100B, and a right edge thereof may face a center of an R pixel 100R adjacent to the B pixel 100B. A left edge of a second color separation device 10*b* may face a center of an R pixel 100R, and a right edge thereof may face a center of a B pixel 100B adjacent to the R pixel 100R. Accordingly, a boundary between two adjacent first and second color separation devices 10*a* and 10*b* faces a B pixel 100B or an R pixel 100R. The center of each of the first and second color separation devices 10*a* and 10*b* may face a G pixel 100G. Then, light beams having color components separated by each of the first and second color separation devices 10*a* and 10*b* may be accurately incident upon the corresponding R, G, and B pixels 100R, 100G, and 100B.

Figure 10:
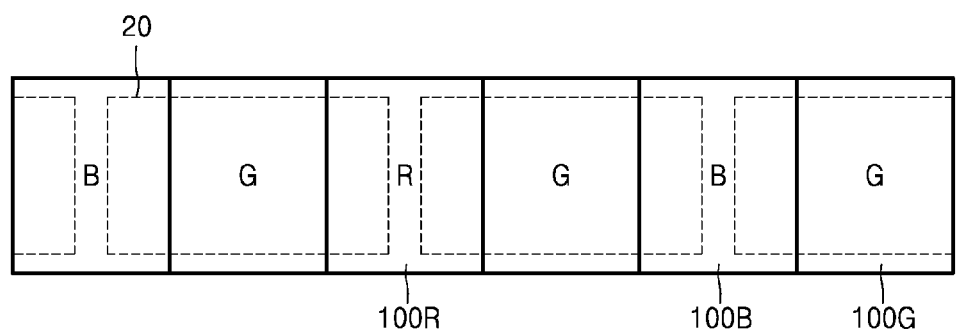
FIG. 10 is a plan view schematically illustrating a pixel configuration of the image sensor of FIG. 9.

A plurality of condensing lenses 20 may be arranged on the first and second color separation devices 10*a* and 10*b*, respectively. The condensing lenses 20 may correspond to the first and second color separation devices 10*a* and 10*b*, respectively, to provide incident light to the respective junction surfaces 13 of the first and second color separation devices 10*a* and 10*b*. As illustrated in FIG. 10, each condensing lens 20 may extend over a set of a R pixel 100R, a G pixel 100G, and a B pixel 100B that is opposite to a first or second color separation device 10*a* or 10*b* corresponding to the condensing lens 20. For example, a condensing lens 20 corresponding to a first color separation device 10*a* may extend between respective centers of a B pixel 100B and a R pixel 100R included in a set, and a condensing lens 20 corresponding to a second color separation device 10*b* may extend between respective centers of a R pixel 100R and a B pixel 100B included in a set. Accordingly, the width of each of the first and second color separation devices 10*a* and 10*b* and that of each condensing lens 20 may be equal to a total width of two pixels.

Figure 11:
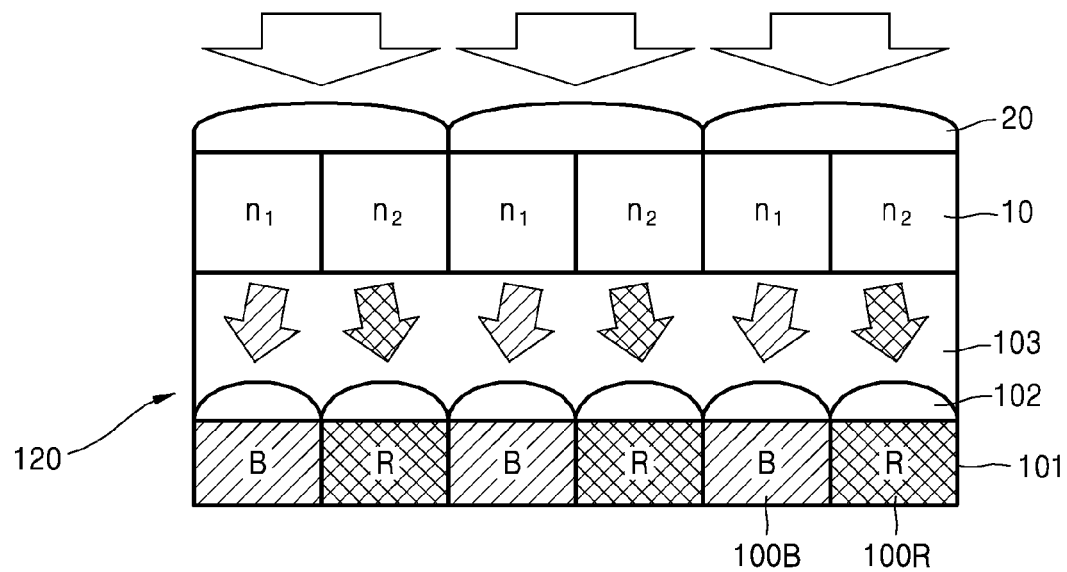
FIG. 11 is a schematic cross-sectional view of an image sensor according to another example embodiment.
Figure 12:
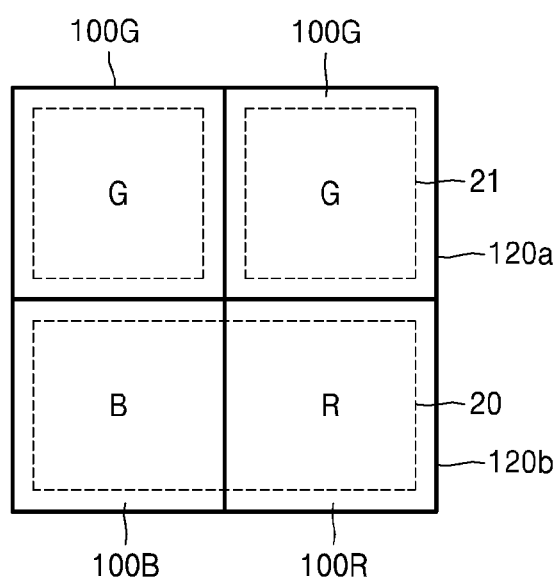
FIG. 12 is a plan view schematically illustrating a pixel configuration of the image sensor of FIG. 11.

FIG. 11 is a schematic cross-sectional view of a structure of an image sensor 120 according to another example embodiment. FIG. 12 is a plan view schematically illustrating a pixel configuration of the image sensor 120 of FIG. 11. Referring to FIGS. 11 and 12, the image sensor 120 may include a pixel array including a plurality of R, G, and B pixels 100R, 100G, and 100B sensing light beams of different wavelengths, and a color separation device array that is disposed to face the pixel array and includes a plurality of color separation devices 10.

As shown in FIG. 12, the pixel array may include a first pixel row 120*a* in which a plurality of G pixels 100G are arranged and a second pixel row 120*b* in which blue pixels 100B and R pixels 100R are alternately repeated. Although only the first pixel row 120*a* and the second pixel row 120*b* are illustrated in FIG. 12 for convenience of explanation, a plurality of first pixel rows 120*a* and a plurality of second pixel rows 120*b* may be alternately repeated in practice.

In the present embodiment, each color separation device 10 may be disposed to face a B pixel 100B and a R pixel 100R arranged adjacent to each other in the second pixel row 120*b*, and no color separation devices 10 may be disposed on the first pixel row 120*a*. In this case, similar to a conventional pixel structure, a color filter that transmits only green light may be disposed on the G pixels 100G in the first pixel row 120a. A plurality of condensing lenses 20 may be arranged on the color separation devices 10, respectively. The condensing lenses 20 may correspond to the color separation devices 10, respectively, to provide incident light to the respective junction surfaces 13 of the color separation devices 10. Accordingly, as illustrated in FIG. 12, each condensing lens 20 may extend over a set of a B pixel 100B and a R pixel 100R that faces a color separation device 10 corresponding to the condensing lens 20, and the width of each color separation device 10 and that of each condensing lens 20 may be equal to a total width of two pixels. A lens 21 may be disposed on each of the G pixels 100G in the first pixel row 120a.

In FIG. 11, only a cross-section of the second pixel row 120b of FIG. 12 is illustrated. Referring to FIG. 11, each color separation device 10 may be configured such that red light travels toward a right region thereof and blue light travels toward a left region thereof. Accordingly, light beams having color components separated by each color separation device 10 may be accurately incident upon the corresponding R and B pixels 100R and 100B.

Figure 13:
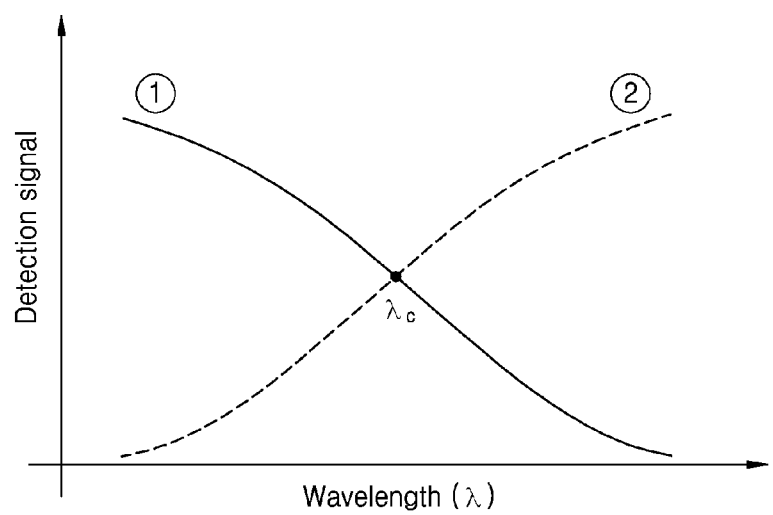
FIG. 13 is a graph illustrating spectrum distributions of light beams respectively incident upon pixels of the image sensor of FIG. 11.

FIG. 13 is a graph illustrating spectrum distributions of light beams respectively incident upon R and B pixels 100R and 100B of the image sensor 120. In FIG. 13, curve ① indicates the spectrum distribution of the light beam incident upon the B pixel 100B, and curve ② indicates the spectrum distribution of light beam incident upon the R pixel 100R. As shown in FIG. 13, light beams of separated color components are almost accurately incident upon R and B pixels 100R and 100B, respectively, corresponding to the light beams.

Figure 14:
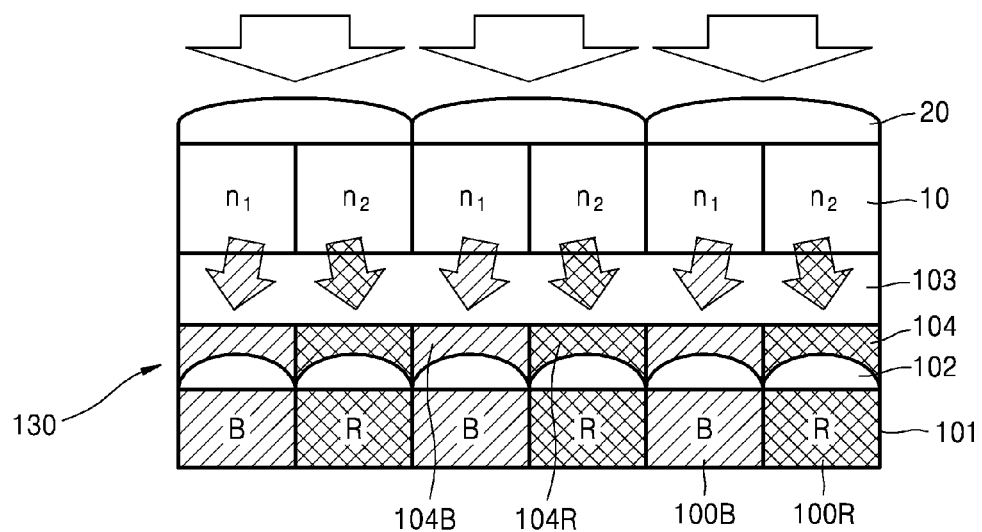
FIG. 14 is a schematic cross-sectional view of an image sensor according to another example embodiment.

FIG. 14 is a schematic cross-sectional view of a structure of an image sensor 130 according to another example embodiment. The image sensor 130 of FIG. 14 is different from the image sensor 120 of FIG. 11 in that a color filter layer 104 transmitting only light of a specific wavelength region and blocking light of other wavelength regions is further included. Although the color filter layer 104 is disposed on a microlens 102 in FIG. 14, the color filter layer 104 may be disposed anywhere between a light sensing layer 101 and a color separation device 10. In the present embodiment, a certain color separation effect may be obtained using the color separation device 10 and high color purity may be obtained using the color filter layer 104. Accordingly, light utilization efficiency may be improved, compared to when only the color filter layer 104 is used, and color purity may be increased, compared to when only the color separation device 10 is used. Consequently, both high color purity and high light utilization efficiency may be obtained. Although not shown, the color filter layer 104 may be applicable to the image sensors 100 and 110 of FIGS. 6 and 9.

Figure 15:
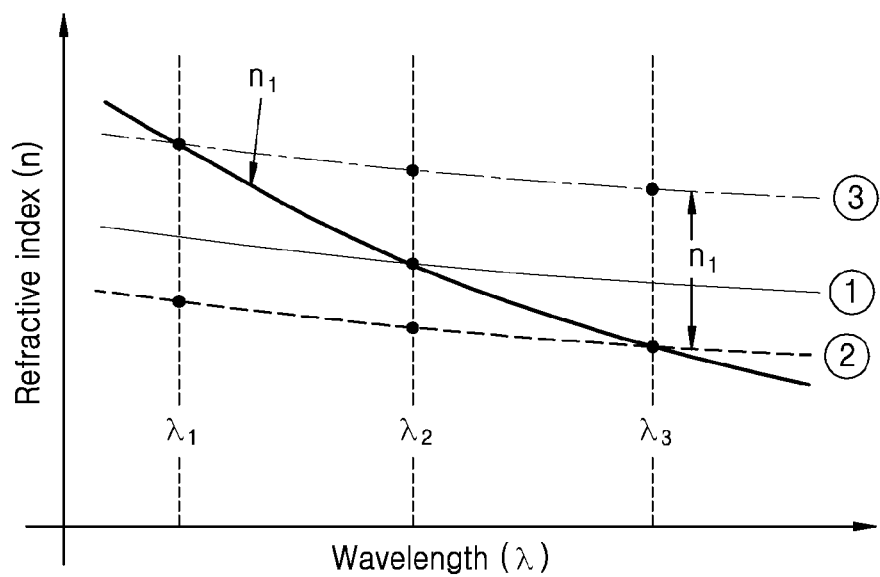
FIG. 15 is a graph showing variations of refractive index distribution curves of a first element and a second element of the color separation device versus wavelengths.

It has been described above that the first refractive index distribution curve $n_1$ of the first element 11 of the color separation device 10 intersects the second refractive index distribution curve $n_2$ of the second element 12 thereof at the green wavelength region $\lambda_2$. However, the location of the intersection between the first and second refractive index distribution curves $n_1$ and $n_2$ may be changed by changing the refractive index of the first or second element 11 or 12 by doping the first element 11 or the second element 12 with impurities. For example, FIG. 15 is a graph showing refractive index distribution curves of the first element 11 and the second element 12 of each color separation device 10 versus wavelengths of incident light. Referring to FIG. 15, the first element 11 may be maintained as it is, and the refractive index of the second element 12 may be increased or decreased by doping the second element 12 with impurities. For example, in curve ①, the first refractive index distribution curve $n_1$ and the second refractive index distribution curve $n_2$ cross at the green wavelength region $\lambda_2$. If the refractive index of the second element 12 is increased as in curve ③, the first refractive index distribution curve $n_1$ and the second refractive index distribution curve $n_2$ may cross at the blue wavelength region $\lambda_1$. If the refractive index of the second element 12 is decreased as in curve ②, the first refractive index distribution curve $n_1$ and the second refractive index distribution curve $n_2$ may cross at the red wavelength region $\lambda_3$.

Figure 16:
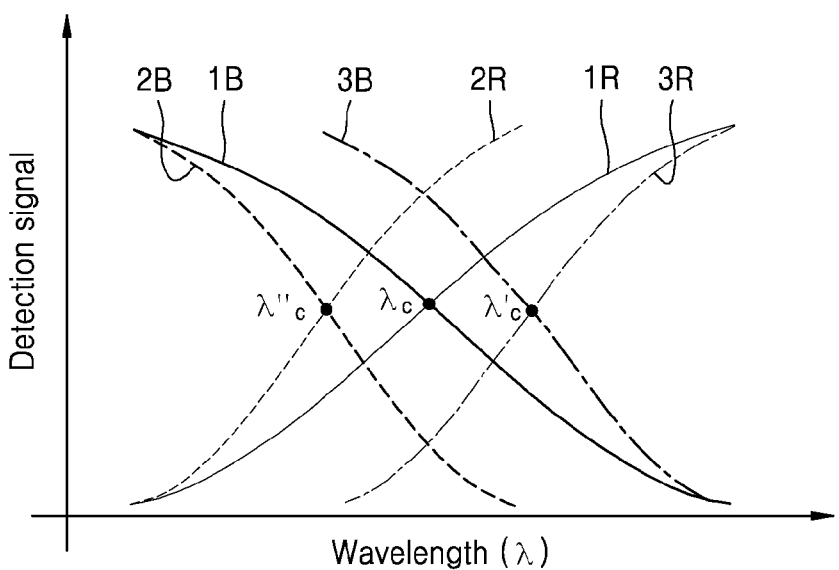
FIG. 16 is a graph showing variations in the spectrums of light transmitted by the color separation device with respect to the variations in the refractive index distribution curves of FIG. 15.

FIG. 16 is a graph showing variations in the spectrums of light transmitted by the color separation device 10 with respect to variations in the refractive index distribution curves of FIG. 15. For example, curves '1B' and '1R' of FIG. 16 indicate the spectrum distributions of light beams respectively incident upon a B pixel 100B and an R pixel 100R in the case of the refractive index distribution indicated by curve ① of FIG. 15. For example, curves '2B' and '2R' of FIG. 16 indicate the spectrum distributions of light beams respectively incident upon a B pixel 100B and an R pixel 100R in the case of the refractive index distribution indicated by curve ② of FIG. 15. For example, curves '3B' and '3R' of FIG. 16 indicate the spectrum distributions of light beams respectively incident upon a B pixel 100B and an R pixel 100R in the case of the refractive index distribution indicated by curve ③ of FIG. 15. Accordingly, according to the pixel structures of the image sensors 100, 110, 120, and 130, a wavelength at which the first and second refractive index distribution curves $n_1$ and $n_2$ intersect may be appropriately selected.

Figure 17:
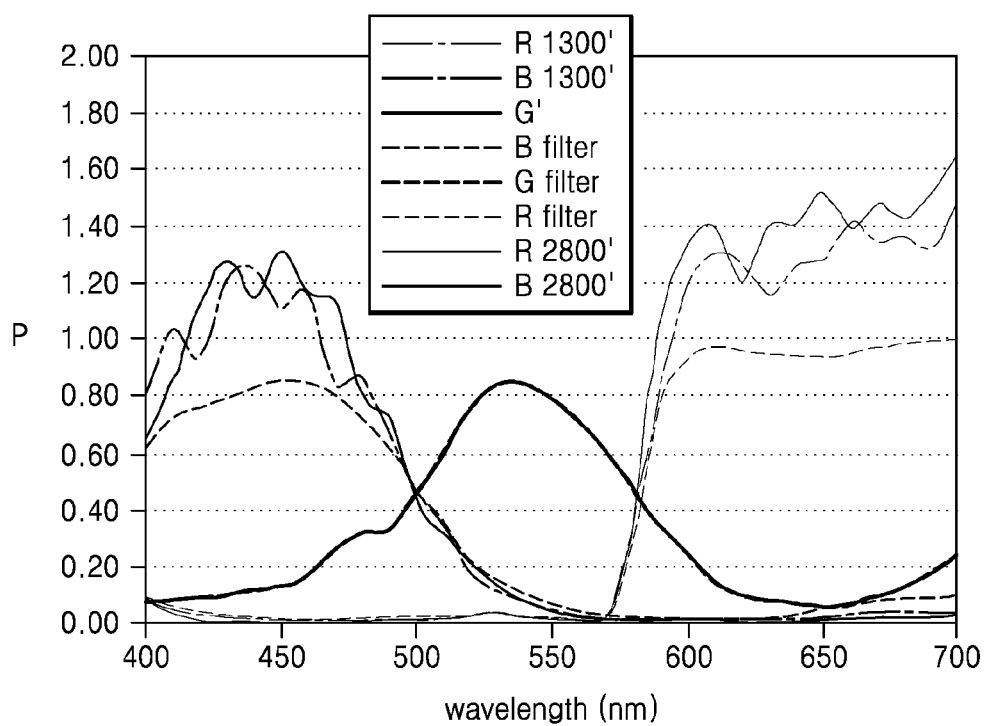
FIG. 17 is a graph showing spectrum distributions for indicating a comparison in light utilization efficiency between the color separation device and a color filter.

FIG. 17 is a graph showing spectrum distributions for indicating a comparison in light utilization efficiency between the color separation device 10 and a color filter. In FIG. 17, the vertical axis indicates the intensities of light beams measured by the R, G, and B pixels 100R, 100G, and 100B and it is assumed that the intensities of B, G, and R light beams included in white light are respectively 1. Referring to FIG. 17, a dashed line indicates a spectrum distribution when a color filter is used, and a measured light intensity does not exceed 1 at any wavelength. On the other hand, solid lines and chain lines indicate spectrum distributions when the color separation device 10 is used, and light utilization efficiency is greatly increased at blue and red wavelengths because light beams of blue and red regions which would not be incident on their corresponding pixels and be lost when using the color filter are refracted by the color separation device 10 and thus can be additionally used. In FIG. 17, the chain lines indicate a case where the thickness of the transparent spacer layer 103 is about 1300 nm and the solid lines indicate a case where the thickness of the transparent spacer layer 103 is about 2800 nm. According to the example of FIG. 17, light utilization efficiency may be increased by appropriately selecting a thickness for the transparent spacer layer 103.

A color separation device and an image sensor including the color separation device according to one or more exemplary embodiments have been described and illustrated in the accompanying drawings. It should be understood that the exemplary embodiments described therein should be considered in a descriptive sense only and not for purposes of limitation. Descriptions of features or aspects within each embodiment should typically be considered as available for other similar features or aspects in other embodiments.

While the present disclosure has been particularly shown and described with reference to exemplary embodiments thereof, it will be understood by those of ordinary skill in the art that various changes in form and details may be made therein without departing from the spirit and scope of example embodiments as defined by the following claims.

What is claimed is:

1. An image sensor comprising:
    a pixel array comprising a plurality of pixels configured to sense light beams of different wavelengths, respectively; and
    a color separation device array including a plurality of color separation devices, each color separation device facing at least two of the plurality of pixels included in the pixel array,
    each of the color separation devices includes,
        a first element having a first refractive index that varies according to wavelengths of light along a first refractive index distribution curve;
        a second element having a second refractive index that varies according to wavelengths of light along a second refractive index distribution curve, the second refractive index distribution curve being different from the first refractive index distribution curve; and
        a junction surface between the first and second elements formed by joining the first and second elements together, wherein
    the pixel array comprises a first pixel configured to sense light of a first wavelength, a second pixel configured to sense light of a second wavelength, and a third pixel configured to sense light of a third wavelength,
    the first and third pixels are alternately and repeatedly arranged with the second pixel between the first pixel and third pixels, and
    the color separation device array comprises a plurality of first color separation devices and a plurality of second color separation devices that are alternately repeated, and left and right sides of each of the first color separation devices and each of the second color separation devices are opposites.

2. The image sensor of claim 1, wherein
    each of the color separation devices is configured such that the first refractive index distribution curve and the second refractive index distribution curve intersect at at least one point, and
    a pixel configured to receive light of a wavelength corresponding to an intersection point of the first refractive index distribution curve and the second refractive index distribution curve, from among the plurality of pixels included in the pixel array, faces a center of each of the color separation devices.

3. The image sensor of claim 1, wherein a first edge of each of the first color separation devices faces a center of the first pixel, a second edge of the each first color separation device faces a center of the third pixel, a first edge of each of the second color separation devices faces the center of the third pixel, a second edge of each of the second color separation devices faces the center of the first pixel, and a center of each of the first and second color separation devices faces the second pixel.

4. The image sensor of claim 3, wherein each of the color separation devices further comprises a condensing lens opposite to a light incidence surface of each of the color separation devices over the center of the first pixel through to the center of the third pixel to concentrate light on the junction surface.

5. The image sensor of claim 1, wherein
    each of the plurality of pixels comprises a light sensing layer configured to convert an intensity of incident light to an electrical signal and a transparent spacer layer on the light sensing layer, and
    each of the color separation devices is on the transparent spacer layer.

6. The image sensor of claim 5, wherein each of the plurality of pixels further comprises a microlens between the light sensing layer and the transparent spacer layer, and a color filter layer configured to transmit only light of a specific wavelength region and block light of other wavelength regions.

* * * * *